(12) United States Patent
Leibiger et al.

(10) Patent No.: US 8,048,224 B2
(45) Date of Patent: Nov. 1, 2011

(54) PROCESS FOR PRODUCING A III-N BULK CRYSTAL AND A FREE-STANDING III-N SUBSTRATE, AND III-N BULK CRYSTAL AND FREE-STANDING III-N SUBSTRATE

(75) Inventors: Gunnar Leibiger, Freiberg (DE); Frank Habel, Freiberg (DE); Stefan Eichler, Dresden (DE)

(73) Assignee: Freiberger Compound Materials GmbH, Freiberg (DE)

( * ) Notice: Subject to any disclaimer, the term of this patent is extended or adjusted under 35 U.S.C. 154(b) by 336 days.

(21) Appl. No.: 11/745,239

(22) Filed: May 7, 2007

(65) Prior Publication Data

US 2007/0257334 A1    Nov. 8, 2007

Related U.S. Application Data

(60) Provisional application No. 60/798,314, filed on May 8, 2006.

(51) Int. Cl.
*C30B 21/02*    (2006.01)
(52) U.S. Cl. ............... 117/89; 117/90; 117/91; 117/92; 117/201; 117/202
(58) Field of Classification Search .............. 117/201, 117/202, 89, 90, 91, 92
See application file for complete search history.

(56) References Cited

U.S. PATENT DOCUMENTS

| | | |
|---|---|---|
| 6,325,850 B1 | 12/2001 | Beaumont et al. |
| 6,596,079 B1 | 7/2003 | Vaudo et al. |
| 6,616,757 B1 | 9/2003 | Melnik et al. |
| 6,936,357 B2 | 8/2005 | Melnik et al. |
| 2003/0070610 A1 | 4/2003 | Dadgar et al. |
| 2005/0000406 A1 | 1/2005 | Janzen et al. |
| 2005/0164044 A1 | 7/2005 | Melnik et al. |
| 2005/0212001 A1 | 9/2005 | Melnik et al. |

FOREIGN PATENT DOCUMENTS

| | | |
|---|---|---|
| WO | WO 99/20816 A1 | 4/1999 |
| WO | WO 01/68955 A1 | 9/2001 |

OTHER PUBLICATIONS

S. Porowski, "Near Defect Free GaN Substrates", MRS Internet J. Nitride Semiconduct. Res. 451, 1999, G 1.3, 11 pgs.
M. K. Kelly et al., "Large Free-Standing GaN Substrates by Hydride Vapor Phase Epitaxy and Laser-Induced Liftoff", Jpn. J. Appl. Phys., vol. 38, 1999, pp. L217-L219.

(Continued)

*Primary Examiner* — Robert M Kunemund
(74) *Attorney, Agent, or Firm* — Foley & Lardner LLP

(57) ABSTRACT

Embodiments of the invention relate to a process for producing a III-N bulk crystal, wherein III denotes at least one element selected from group III of the periodic system, selected from Al, Ga and In, wherein the III-N bulk crystal is grown by vapor phase epitaxy on a substrate, and wherein the growth rate is measured in real-time. By actively measuring and controlling the growth rate in situ, i.e. during the epitaxial growth, the actual growth rate can be maintained essentially constant. In this manner, III-N bulk crystals and individualized III-N single crystal substrates separated therefrom, which respectively have excellent crystal quality both in the growth direction and in the growth plane perpendicular thereto, can be obtained.

21 Claims, 4 Drawing Sheets

OTHER PUBLICATIONS

K. Motoki et al., "Preparation of Large Freestanding GaN Substrates by Hydride Vapor Phase Epitaxy Using GaAs as a Starting Substrate", Jpn. J. Appl. Phys., vol. 40, 2001, pp. L140-L143.

Y. Melnik et al., "Properties of Free-Standing GaN Bulk Crystals Grown by HVPE", Mat. Res. Soc. Symp. Proc., vol. 482, 1998, pp. 269-274.

Hwa-Mok Kim et al., "Preparation of 30x30 mm$^2$ Free-Standing GaN Wafer by Mechanical Liftoff and Optical Properties in The Backside of The Free GaN by Cathodoluminescence", Mat. Res. Soc. Symp., vol. 639, 2001, pp. G6.51.1-G6.51.6.

S. Fujiwara et al., "Crystal growth of ZnSe by PVT using a semi-open ampule", Journal of Crystal Growth 169 (1996), pp. 660-664.

Y. Huang et al., "Spatial characterization of a 2 in GaN wafer by Raman spectroscopy and capacitance-voltage measurements", Journal of Physics D: Applied Physics 37 (2004), pp. 2814-2818.

N. Kato et al., "Evaluation of strain in AlN thin films grown on sapphire and 6H-SiC by metalorganic chemical vapor deposition", Phys. Stat. Sol. (c) 3, No. 6, (2006) pp. 1671-1674.

T. Suzuki et al., In-situ monitoring of AlN crystal growth on 6H-SiC by the use of a pyrometer, Materials Science Forum, vols. 457-460 (2004), pp. 1565-1568.

PROCESS FOR PRODUCING A III-N BULK CRYSTAL AND A FREE-STANDING III-N SUBSTRATE, AND III-N BULK CRYSTAL AND FREE-STANDING III-N SUBSTRATE

CROSS-REFERENCE TO RELATED PATENT APPLICATIONS

This application claims priority from U.S. Provisional Application 60/798,314, filed May 8, 2006, incorporated herein by reference in its entirety.

BACKGROUND OF THE INVENTION

The present invention relates to processes for producing III-N bulk crystals from a gas or vapor phase, an well as to a process for producing free-standing III-N substrates which are obtained from the III-N bulk crystals. The term "III-N" denotes a III-N compound, where III denotes at least one element of group III of the periodic table of elements, selected from aluminum, gallium and indium (in the following sometimes abbreviated by (Al, Ga, In)), and N denotes nitrogen. The III-N bulk crystal and the free-standing III-N substrate comprise the III-N compound as the main material, and they are respectively preferably composed essentially of or completely of the III-N compound, optionally together with impurities. The invention further relates to III-N bulk crystals and freestanding III-N substrates as such, which are advantageously obtainable by such processes. The free-standing III-N substrates are particularly suitable as substrates for the manufacture of optoelectronic and electronic apparatuses.

In industrial applications, components or devices for (Al, Ga, In) N-based light-emitting diodes or laser diodes have conventionally been grown on or above foreign substrates, such as $Al_2O_3$ (sapphire) or SiC. The drawbacks relating to crystal quality and consequently lifetime and efficiency of the component or the device, which result from the use of foreign substrates, can be mitigated through growth on III-N substrates, such as e.g. (Al, Ga) N substrates. Until now, however, such substrates have not been available in sufficient quality. This is largely caused by difficulties in conventional bulk growth technologies due to the extremely high steady state vapor pressure of nitrogen over III-N compounds at typical growth temperatures. The growth of bulk material under high pressure was described by Porowski (MRS Internet J. Nitride Semiconduct. Res. 4S1, 1999, G1.3). This process provides qualitatively valuable GaN bulk material, but has the disadvantage that, up to now, only small GaN substrates with a surface area of maximally 100 mm² can be produced thereby. Furthermore, the production process requires a long production time in comparison with other processes and is technologically laborious and cost-intensive due to the extremely high growth pressures.

A further method consists in the growth of III-N materials on a foreign substrate from the gas phase or vapor phase, followed by separation from the foreign substrate. For the production of thick free-standing layers of III-N, such as GaN, it is known e.g. from M. Kelly et al. (Jpn. J. Appl. Phys. Vol. 38, 1999, pp. L217-L219), "Large Free-Standing GaN Substrates by Hydride Vapor Phase Epitaxy and Laser Induced Lift-Off", to separate a thick GaN layer, which had been previously grown on a substrate made of sapphire ($Al_2O_3$) by means of hydride vapor phase epitaxy (HVPE), from the sapphire substrate. For this purpose, the document describes irradiating the GaN-deposited sapphire substrate with a laser, with the result that the GaN layer is locally thermally decomposed at the interface with the sapphire substrate, and thereby lifting off from the sapphire substrate. Alternative separation methods include wet chemical etching (for example of GaAs; see K. Motoki et al. Jap. J. Appl. Phys. Vol. 40, 2001, pp. L140-L143), dry chemical etching (for example of SiC; Yu. Melnik et al., Mat. Res. Soc. Symp. Proc. Vol. 482, 1998, pp. 269-274) or mechanical lapping (for example of sapphire; see H.-M. Kim et al., Mat. Res. Soc. Symp. Proc. Vol. 639, 2001, pp. G6.51.1-G6.51.6) of the substrate. Drawbacks of the aforementioned methods lie on the one hand in the relatively high costs due to the complex technologies for substrate separation, and on the other hand in the fundamental difficulty to produce III-N materials having a homogenously low defect density.

The growth of thick III-N bulk crystals (boules) on a III-N substrate by vapor phase epitaxy and the subsequent separation of the bulk crystals to obtain single III-N substrates by a sawing process offer an alternative to the aforementioned processes. Such a process was described by Vaudo et al. (U.S. Pat. No. 6,596,079). HVPE was chosen as the preferred growth method; as preferred boule crystal lengths, values of >1 mm, 4 mm or 10 mm are indicated. Vaudo et al, further describe inter alia how III-N substrates are obtained from the bulk crystal by wire sawing or further treatment steps, such as chemical/mechanical polishing, reactive ion etching or photo-electrochemical etching. Furthermore, III-N bulk crystals and substrates produced by the aforementioned technique are also mentioned in an international patent application of Vaudo et al. (WO 01/68955 A1).

Melnik et al. describe a process for the growth of GaN- (U.S. Pat. No. 6,616,757) or AlGaN-bulk crystals (US 2005 0212001 A1) having crystal lengths greater than 1 cm. The process basically consists of the steps: growth or a single crystalline (Al)GaN layer on a substrate, removing the substrate and washing the (Al)GaN bulk crystal on the single crystal (Al)GaN layer. As a preferred method a HVPE process with a specific reactor configuration is mentioned. Further, Melnik et al. describe in a US application (US 2005-0164044 A1) and in U.S. Pat. No. 6,936,357 GaN- and AlGaN-bulk crystals having various characteristics, such as dimensions, dislocation densities or full widths at half maximum of X-ray rocking curves.

SUMMARY OF THE INVENTION

An object of the present invention is to provide a process for producing III-N bulk crystals, and to provide III-N substrates, respectively having excellent crystal quality and a homogenous distribution thereof in the direction of growth and/or in the plane being perpendicular thereto.

According to a first aspect, the present invention provides a process for producing a III-N bulk crystal, wherein III denotes at least one element from group III of the periodic system, selected from Al, Ga and In, wherein the III-N bulk crystal is grown by means of vapor phase epitaxy on a substrate or a template, and wherein the growth rate is measured in real-time.

In a preferred embodiment of the first aspect of the invention, the growth rate is actively controlled.

According to a second aspect, the present invention provides a process for preparing a III-N bulk crystal, wherein III denotes at least one element from group III of the periodic system, selected from Al, Ga and In, wherein the III-N bulk crystal, is grown on a substrate or a template by means of vapor phase epitaxy, and wherein the growth rate is maintained essentially constant at least one value during epitaxial growth. The process operation according to the invention enables essentially maintaining the growth rate during a main part, preferably during essentially the whole process and, if desired, during the complete process for the growth of the bulk crystal to the desired length. The term "essentially constant" used according to the invention means that the inventive crystal quality described in further detail below can be achieved. In a preferred embodiment, a correction or adjustment to an actually constant growth rate is carried out, when the method for measuring the growth rate determines a difference of maximally 10%, particularly a difference of maximally 5%, and above all a difference of maximally 2% when comparing the actual growth rate with the nominal (desired) growth rate. In a further preferred manner, the growth rate is exactly constant, i.e. lying within the control accuracy (standard deviation±0.5%). During the whole growth process for the III-N bulk crystal of desired thickness, the growth rate can be maintained at one predetermined value; or the growth rate may be maintained, in partial periods, at multiple different predetermined, yet respectively constant values.

In preferred embodiments of the first and the second aspects of the invention, the epitaxial growth of the III-N bulk crystal may be carried out directly on a hetero substrate (foreign substrate) or on a homo substrate (native substrate). Prior to the growth of the III-N bulk crystal, one or more intermediate layers may be deposited to form a template comprising the hetero or homo substrate, the composition of which intermediate layer(s) may be selected independently from that of the III-N bulk crystal. Process, technique and/or apparatus for one deposition of the intermediate layer(s) may be selected freely. For example, the growth rate of the intermediate layer(s) may be either measured or measured and maintained constant, or it may neither be measured nor be maintained constant.

In a preferred embodiment of the first and the second aspects of the invention, hydride vapor phase epitaxy is used as the growth method.

For measuring or determining the growth rate, a method is particularly suitable that is selected from the following group of methods:
  weighing the crystal or the crystal and a crystal holder including a susceptor;
  determining a duration or running time of an ultrasonic wave which is reflected from the growth surface;
  determining a crystal shadow obtained by illumination, for example by sideward illumination of the growing crystal and detecting the moving shadow behind the growing crystal by means of CCD (shadow casting principle); and
  optical triangulation, i.e. determining the angle, under which a laser beam being reflected at the growth surface is detected.

In a preferred embodiment of the first and second aspects of the invention, the position of the growing front plane/face is kept constant by real-time control.

In a preferred embodiment of the first and second aspects of the invention, a III-N substrate or template having c-, a-, m- or r-plane as the growth face/plane is used as the substrate, and the III-N bulk crystal is deposited on the thus selected growth plane/face.

In a preferred embodiment of the first and second aspects of the invention, a III-N substrate having a growth plane having an off-angle (miscut) of 0.1-30° relative to the c-, a-, m- or r-plane is used as the substrate, and the III-N bulk crystal is deposited thereon.

In a preferred embodiment of the first and second aspects of the invention, a doped III-N bulk crystal is deposited on a substrate or template, which preferably itself is a doped III-N substrate or template, wherein an element selected from the group consisting of silicon, tellurium, magnesium and iron is respectively used as the dopant.

In a preferred embodiment of the first and second aspects of the invention, the grown III-N bulk crystal has a circular or an almost circular in-plane cross-section, the circular cross-section having a diameter of ≧5 cm. the length of the grown III-N bulk crystal is preferably ≧1 mm, more preferably ≧1 cm and in particular ≧3 cm.

The particular advantages of the present invention are, among others, that the unique characteristics with respect to crystal quality and homogenous distribution of the crystal quality, in particular in the growth plane perpendicular to the growth direction, are achievable with the aforementioned desirable dimensions of the grown III-N bulk crystal and the individualized, free-standing III-N substrate produced therefrom.

In a preferred embodiment of the first and second aspects of the invention, single crystalline form of sapphire, silicon carbide, gallium arsenide, lithium aluminate or silicon is respectively used as the substrate, on which the III-N bulk crystal is grown according to the invention. In a particularly preferred embodiment, a GaN substrate is used as a substrate in a free-standing form or in a template form, and a GaN bulk crystal is grown according to the invention.

After carrying out the process according to the invention, free-standing III-N crystal substrates can be easily produced by separating one or more III-N substrates from the III-N bulk crystal. Various suitable methods for separation are known, wire sawing being a particularly suitable one. Subsequently, further treatment steps can be carried out, where lapping, polishing (chemical, and/or mechanical), etching (wet and/or dry), subsequent thermal treatment, conditioning in gas atmosphere (suitably containing at least ammonia), and/or any desirable finishing or cleaning steps can be particularly exemplified.

According to a further aspect of the invention, a III-N bulk crystal having unique crystal quality is provided. The III-N bulk crystal of the invention is obtainable by the process according to the invention described above. Preferably, the III-N bulk crystal is prepared by the inventive process in accordance with the first and second aspects of the invention as defined above, and optionally in accordance with the preferred embodiments mentioned above.

The unique, surprisingly good crystallinity of the III-N bulk crystal and of the individualized and free-standing III-N substrates correspondingly separated therefrom in accordance with the present invention can be defined in particular by rocking curve mapping and/or micro Raman mapping.

Thus, when performing a rocking curve mapping of the III-N bulk crystal of the invention on a plane
  (i) parallel to the growth plane and/or
  (ii) in the growth direction,
  the standard deviation of the respectively measured full width at half maximum
  in case (i) is 5% or lower, preferably 3% or lower,
  in case (ii) is 10% or lower, preferably 7.5% or lower.

The standard deviation is typically determined by carrying out rocking curve mapping measurements respectively at a plurality of, e.g., 100 measurement points (or another number of locations) on plane (i) or (ii) to be measured, forming the mean value of the full widths at half maximum of all conducted measurements, and determining the standard deviation relative to this mean value by usual statistical evaluation. If in case (ii) the separation of a wafer plane in the growth direction of a bulk crystal is not desired, one may suitably proceed in a manner that, firstly, a plurality of wafers having planes that are perpendicular to the growth direction are separated from the bulk crystal (for example, as in a usual preparation of wafers, by wire sawing transverse to the longitudinal direction of the bulk crystal), then at a plurality of, e.g., 100 measurement points (or another number of measurement locations), respective Rocking curve mapping measurements are carried out on the thus separated wafers, and, subsequently, the standard deviation of the mean values of full width at half maximum respectively determined with the separated wafers are determined. If, in control measurements, there is a deviation in a sample of the material in comparison to the previously mentioned direct measurement of the standard deviation in the growth direction, the direct measurement in the growth direction is valid due to a higher accuracy.

As an alternative or supplemental quality parameter, in a micro Raman mapping of the III-N bulk crystal of the invention on a plane
  (i) parallel to the growth plane, and/or
  (ii) in the growth direction,
the standard deviation of the measured full width at half maximum of the $E_2$-phonon
  in case (i) is 5% or lower, preferably 3% or lower, further preferably 2% or lower,
  in case (ii) is 10% or lower, preferably 7.5% or lower, further preferably 5% or lower.

Again, the standard deviation is typically determined by carrying out respective micro Raman mapping measurements at a plurality of, e.g., 100 measurement. points (or another number of locations) on plane (i) or (ii) to be measured, forming the mean value of the full widths at half maximum of the $E_2$-phonon of all conducted measurements, and determining the standard deviation relative to this mean value by usual statistical evaluation. In case (ii), one can again suitably proceed that, firstly, a plurality of wafers having a plane being perpendicular to the growth direction is separated from the bulk crystal (for example as in the case of usually preparing wafers by wire sawing transversal to the longitudinal direction of the bulk crystal), then at the plurality of, e.g., 100 measurement points (or another number of measurement locations), respective micro Raman mapping measurements are carried out as mentioned, and, subsequently, the standard deviation of the mean values of full width at half maximum of the $E_2$-phonon being respectively determined with the separated wafers is determined. If, in control measurements with a sample of the material, there is a deviation in comparison the previously mentioned direct measurement of the standard deviation in the growth direction, the direct measurement in the growth direction is valid due to higher accuracy.

By means of separation from the thus provided III-N bulk crystal, single free-standing III-N substrates are obtainable which have a corresponding crystal quality. Thus, in a rocking curve mapping of the free-standing III-N substrate according to the present invention on a plane parallel to the growth plane, the standard deviation of the measured full width at half maximum is 5% or lower, preferably 3% or lower, more preferably 2% or lower.

Likewise, in a micro Raman mapping of the free-standing III-N substrate of the invention on a plane
  (i) parallel to the growth plane, and/or
  (ii) in the growth direction,
the standard deviation of the measured full width at half maximum of the $E_2$-phonon
  in case (i) is 3% or lower, preferably 2% or lower,
  in case (ii) is 5% or lower, preferably 3% or lower.

With respect to the rocking curve mapping measurements and the micro Raman mapping measurements, reference is made to the description above.

DETAILED DESCRIPTION OF THE PREFERRED EMBODIMENTS

Figure 1:
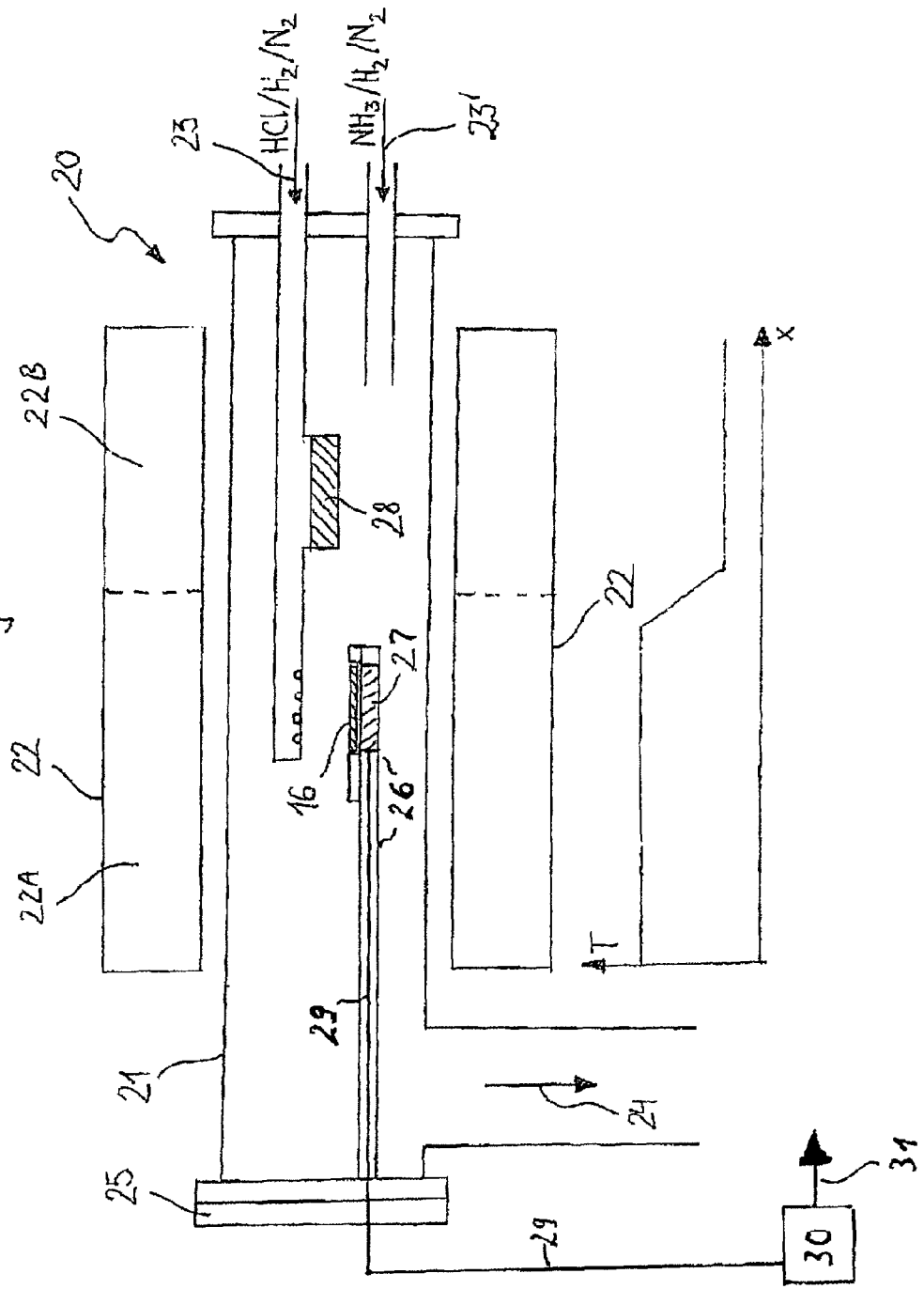
FIG. 1 schematically shows a basic constitution of a HVPE apparatus in cross-section, to which the present invention is applicable.

In the following, preferred embodiments of the invention are described, which are, however, not to be understood in a limiting manner. Rather, this description only serves for the explanation of the invention, and variations and modifications, which are possible within the scope of the annexed claims, will become apparent to the person skilled in the art.

None of the processes of the art as described in the introductory section above, for example the state of the art of Vaudo et al. or Melnik at al., provides a hint such that during crystal growth, the growth rate is measured or controlled in situ. Even if a nominal growth rate is desired or intended, no constant growth rate actually prevails (at least within measurement accuracy) without a suitable control over a period that is required for epitaxial growth of a thick III-N layer or a corresponding bulk crystal, e.g. providing a layer thickness or bulk crystal length of at least 1 mm. Naturally, various factors affect a presumably constant growth rate, including e.g. a formation of facets (with growth planes or faces other than the desired plane or face), a parasitic deposition, a varying temperature field (particularly over the growth plane), an inaccuracy of the mass flow rates of starting components (e.g. of the HCl in-flow and/or the $NH_3$ in-flow), an inaccuracy of the reaction turnover of the starting components (e.g. concurrently with a decreasing fill level of the Ga source), and a non-permanently constant III-N ratio. In accordance with the present invention, it was noted that growth rate in a vapor phase epitaxy process and particularly in HVPE is a parameter which determines the crystal quality so strongly that the measurement and the active control of the growth rate in situ, i.e. during the epitaxial growth, leads to unexpected and significant advantages with respect to crystal quality and the homogenous distribution thereof in the growth direction and/or in the plane perpendicular thereto.

By means of measurement and active control of the growth rate in situ according to the present invention, a growth rate constant within control accuracy can be ensured advantageously during the growth process. At least one, and advantageously a multitude of the aforementioned, optionally occurring factors, that affect and counteract an actual constant growth rate, can be avoided and/or counter-acted and/or compensated. Consequently, III-N bulk crystals and III-N substrates being respectively individualized and separated therefrom, can be provided in accordance with the present invention with a unique combination of good crystal quality and homogenous distribution of crystal quality in the growth direction and/or the plane perpendicular thereto.

A HVPE apparatus is suitably altered according to the invention such that the in situ measurement of the growth rate is ensured by appropriate means. As particularly suitable methods, the following can be used:

(i) weighing the crystal or the crystal plus crystal holder and susceptor by a weighing module, or a load cell or force sensor, (ii) measuring the duration or running time of an ultrasonic wave reflected from the growth surface, (iii) determining the crystal shadow obtained through illumination, for example by means of CCD (shadow casting principle), (iv) optical triangulation, i.e. determining the angle under which a laser beam reflected from the growth surface is detected, Or (v) reflectometry perpendicular to the wafer (less suitable for relatively thick layers).

In a thus modified HVPE apparatus, a foreign substrate or a III-N substrate is used as a starting or seed substrate. A so-called template is also included as a possible substrate form, wherein one or more intermediate layer material(s), independently from the III-N crystal material with respect to the type of material and the method of deposition, is deposited on a (foreign or native) substrate. Preferably, a III-N substrate or a III-N template formed on a foreign substrate is used, for example a GaN template having a diameter of >5 cm and having a (0001) orientation. More preferably, the substrate has a slight misorientation (miscut) of the substrate surface towards the exact (0001) plane, for example in a range of from about 0.3 to about 0.6°.

Already before reaching the growth temperature (i.e. at the lower temperature), a gas atmosphere may be preferably previously fed into the reactor, the gas atmosphere containing one or more gases, preferably selected from the group of gases consisting of hydrogen, nitrogen and ammonia, most preferably including at least an N-containing gas. In particular, gaseous ammonia is applied for the stabilization of the surface. After the growth temperature is reached, the III-N bulk crystal growth is started by supplying the group III starting material. In case of the growth of GaN bulk crystal, this means for example that gaseous hydrogen chloride overflows the Ga source or is blown therethrough, whereby gallium chloride gas is produced and can be fed into the reactor. In addition to the supply of the group III starting material, corresponding starting materials for the dopants may optionally be supplied as desired.

FIG. 1 schematically shows an example for the basic constitution of a HVPE apparatus in cross-section, to which the present invention is applicable. The HVPE apparatus 20 according to a possible embodiment includes a quartz reactor 21, a multi-zone furnace 22 surrounding it, a gas supply 23, 23' indicated by arrows and a pump and exhaust system 24 indicated by an arrow. The template 16, on a substrate holder 26, is introduced into the reactor through the loading and deloading flange 25. By the pump and exhaust system 24, the reactor is than brought to the desired process pressure, suitably in a range of ≦1,000 mbar, for example approximately 950 mbar. The multi-zone furnace has a first zone 22A, which sets the growth temperature on the surface of the substrate, and a second zone 22B, which sets the temperature in the region of a Ga well 28. $H_2$ and/or $N_2$ as carrier gas is supplied to the reactor via gas supply 23, 23'. To produce gallium chloride in situ, the Ga which is present in the Ga well is vaporized by setting a suitable temperature in the zone 22B of multi-zone furnace 22, e.g. to approximately 850° C., and is reacted with HCl, which is made to flow in from the gas supply 23 using $H_2/N_2$ carrier gas in a suitable gas mixing ratio and at a suitable flow rate. The gallium chloride which is produced in situ flows out of the openings at the end of the inflow tube 23 into the reactor 21, where it is mixed with $NH_3$, which is made to flow in from the inflow tube 23' together with a $H_2/N_2$ carrier gas mixture in a suitable gas mixing ratio and at a suitable flow rate to establish a $NH_3$ partial pressure of, for example, approximately 6 to $7\times10^3$ Pa. As will be clear from the temperature profile at the bottom of FIG. 1, a temperature which is higher than that of the zone 22B, is established in the zone 22A of the multi-zone furnace 22, in order to set a substrate temperature of suitably about 950-1,100° C., e.g. at around 1,050° C. GaN is deposited on the substrate holder. If, for example, a (Ga, Al, In) N layer, a (Ga, Al) N layer or a (Ga, In) N layer is to be deposited instead of a GaN layer, additional Al and/or In wells is/are provided in the HVPE apparatus 20. The incoming flow of corresponding aluminum chloride and/or indium chloride into the reactor then takes place as a result of the supply of HCl in suitable carrier gas of for example $H_2/N_2$, similarly to what was demonstrated by inflow tube 23 for Ga in FIG. 1.

The growth of the layer deposited by means of HVPE is continued until a desired layer thickness is achieved, with a growth rate that is maintained constant by active growth measurement and growth control to a prescribed value falling, for example, into a range of 50 to 700 μm/h, preferably in a range of 200 to 500 μm/h. For the active growth measurement and control, the substrate holder 26 includes a suitable measurement device 27, e.g. a weighing module or an ultrasonic emitter and detector unit, which will be respectively explained below in other particular embodiments in, further detail. Via line 29, the value of the growth rate, being thus determined within measurement accuracy, is sent to a computer unit or CPU (controller) 30. If the computer unit or CPU 30 determines a detectable difference of the measured, actual growth rate in comparison with the pre-set nominal growth rate, wherein such a detectable difference may exceed a prescribed, non-tolerable threshold value of for example 2%, the computer unit or CPU (controller) 30 sends a signal 31 for the control of parameters of the growth rate, until the difference between the measured, actual growth rate and the pres-set nominal growth rate falls below the prescribed non-tolerable threshold value. The signal 31 suitably controls one or more of suitable process parameters influencing growth rate; most effectively, it controls flow parameters, particularly HCl flow rate and/or $HCl/NH_3$ flow ratio. In this manner, thick layers having thickness ranges of e.g. 200 μm or above, preferably in the range of 300 to 30,000 μm, may be obtained efficiently and with excellent crystal homogeneity.

Alternatively, the control adjustment of the growth rate may be carried out manually, preferably by adjusting the HCl flow rate.

Figure 2:
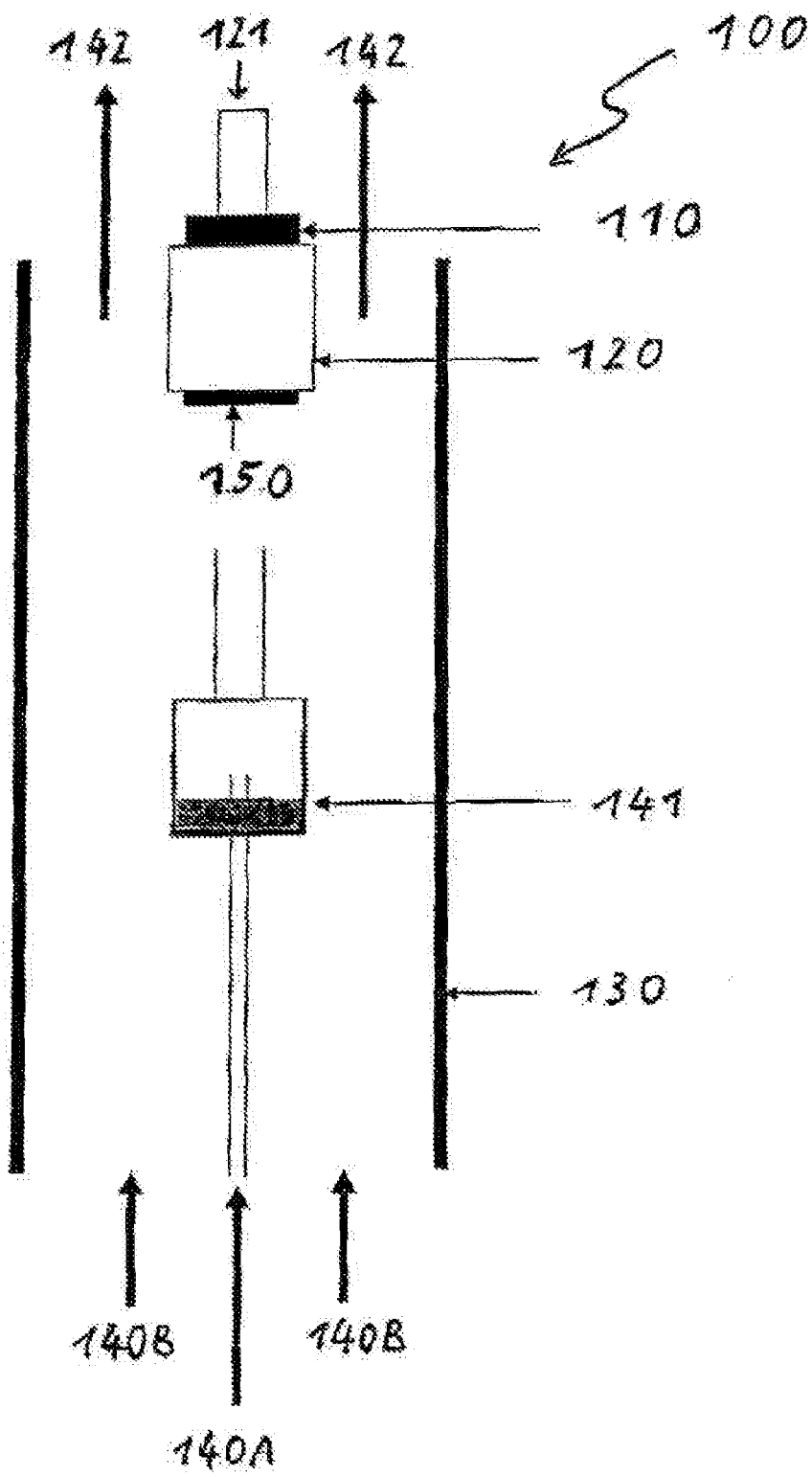
FIG. 2 schematically shows a basic constitution of a HVPE apparatus in cross-section, with which the in situ measurement of the growth rate by means of a weighing module is carried out according to a particular embodiment of the invention.
Figure 3:
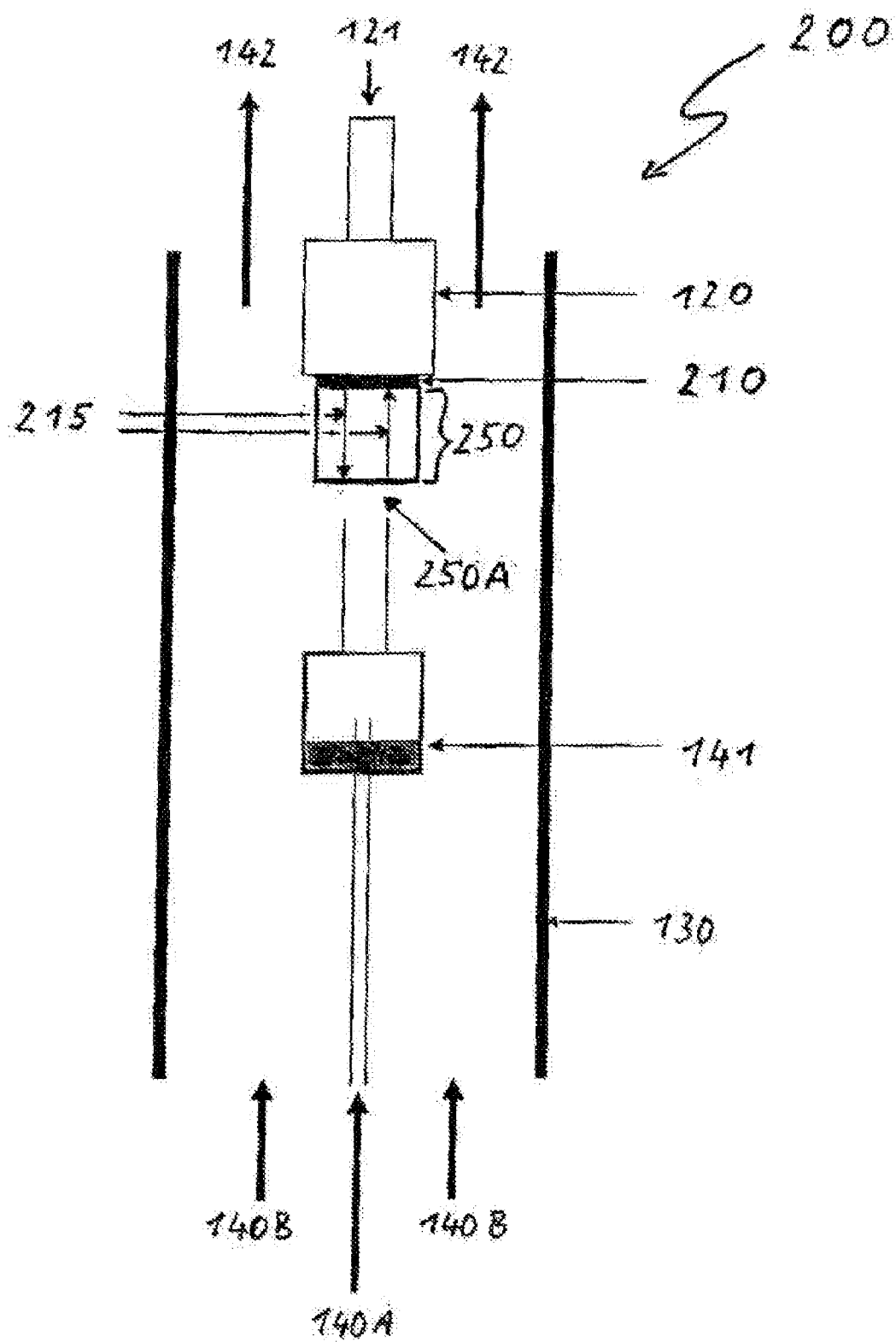
FIG. 3 schematically shows a basic constitution of a HVPE apparatus in cross-section, with which the in situ measurement of the growth rate is carried out by an ultrasonic emitter and detector unit according to another particular embodiment of the invention.
Figure 4:
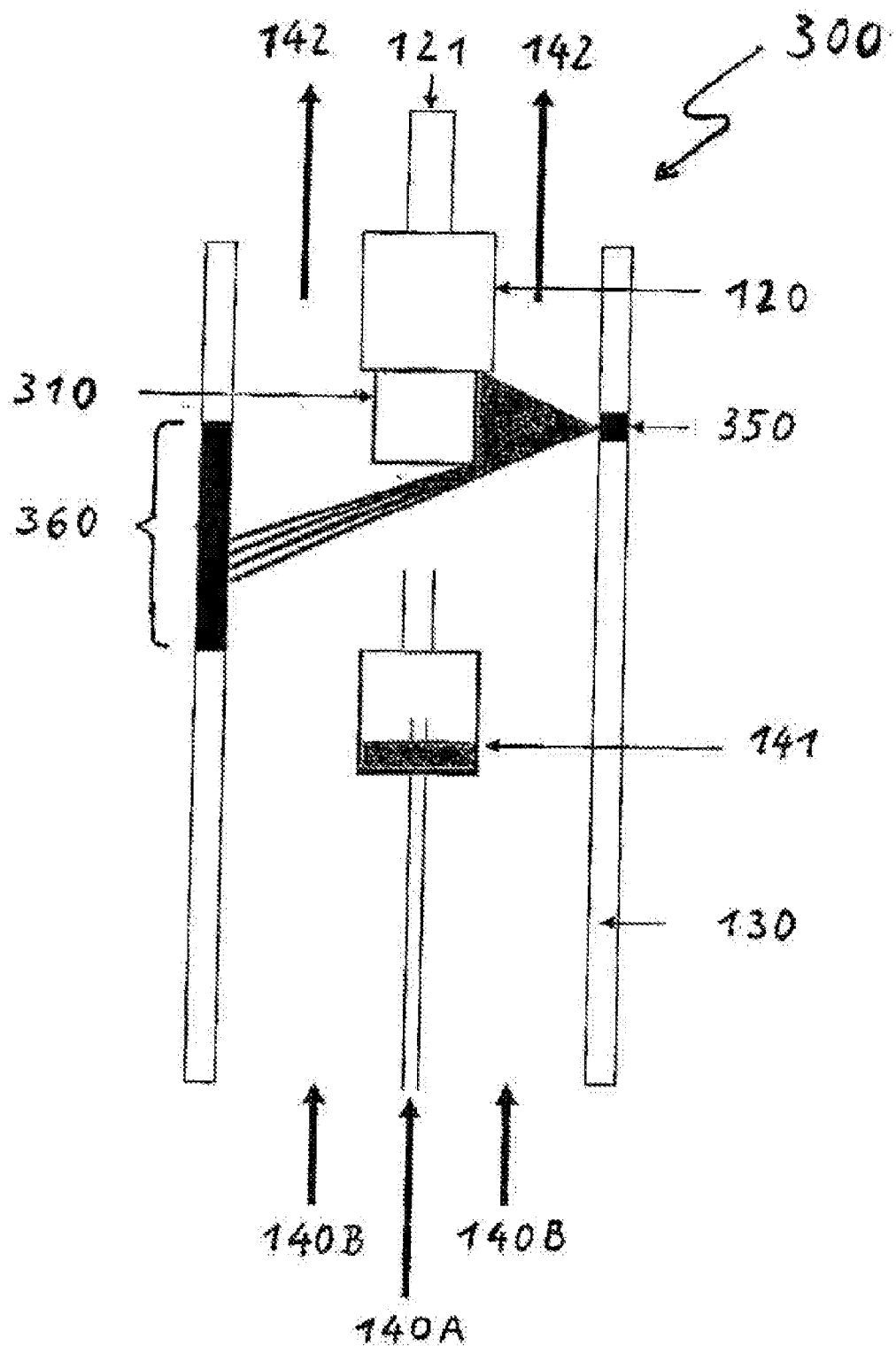
FIG. 4 schematically shows a basic constitution of a HVPE apparatus in cross-section, with which the in situ measurement of the growth rate is carried out by a shadow casting principle according to another particular embodiment of the invention.

FIGS. 2 to 4 schematically show a modified constitution of a HVPE apparatus in cross-section, wherein the in situ measurement of the growth rate is carried out in specific embodiments by using different methods. The different measurement methods are shown in FIG. 2 with a weighing module, in FIG. 3 with an ultrasonic emitter and detector unit, and in FIG. 4 with a shadow casting principle.

FIG. 2 shows a schematic constitution of a vertical HVPE reactor 100 with an integrated weighing module 110. Here, the weighing module 110 is located between a fixed susceptor holder 121 and a susceptor 120; susceptor 120 has substrate 150 being fixed thereto and having an epitaxial layer being grown thereon. Hence, weighing module 110 weights susceptor 120 plus grown substrate 150. With respect to the HVPE reactor 100, there are further shown a reactor wall 130, gas inflows for HCl and for carrier gas (see the middle arrow 140A at the bottom) as well as for NH$_3$ and carrier gas (see the two outer arrows 140B at the bottom) respectively, a Ga source 141, and a gas flow outlet for exhaust gases (see the outer arrows 142 at the top). The use of a weighing module is likewise possible also for a horizontal reactor with a lying substrate, wherein the susceptor including the substrate having the growing epitaxial layer lying thereon is weighed in this case, too. In the following embodiments shown, the elements which are the same as, or correspond to those of the HVPE reactor 100 of FIG. 2, are denoted by the same reference numbers, and description thereof will thus be omitted.

FIG. 3 shows a schematic constitution of a vertical HVPE reactor 200 including an integrated ultrasonic emitter and detector (shown here by a common reference number 210). The ultrasonic emitter and detector 210 is located above substrate 250. The layer thickness is determined here via the duration or running time of ultrasonic waves 215 being reflected at the growth surface 250A of substrate 250. This determined duration or running time is indicative for the rate of epitaxial growth. Likewise, the use of the ultrasonic measurement is also possible for a horizontal reactor having a lying substrate.

FIG. 4 shows schematic constitution of a vertical HVPE reactor 300 including an integrated layer thickness measurement based on a shadow casting principle. Here, the III-N crystal 310 is illuminated sidewards with a light source 350, for example a light emitting diode or a laser diode which can be integrated within the reactor wall 130 or may be provided independently therefrom, and the light is locally detected on the opposite side, by a suitable detector 360 such as a CCD camera, whereby the detector 360 may again be integrated into the reactor wall 310 or may be provided independently therefrom. Here, the shadow of the crystal moves with increasing crystal length over the detector 360. Moving speed of the shadow is indicative for the determination of the growth rate.

The growth rate being determined by a selected method is used in order to actively control the growth rate during the process. For this, access is made to the electronic mass flow controller (MFC), which is responsible for the control of the group III source gas. In case of crystal growth of GaN bulk crystals, it is the MFC which controls the HCl gas flow flowing over or through the Ga source. Additionally, other gas flows, such as that of the N-containing gas (for example of NH$_3$) can be adjusted in this manner as well, if desired. For example, the V-III ratio can be maintained constant in this manner.

Subsequently, an annealing step at the growth temperature or at another temperature may be further applied.

After one or more process step(s), such as e.g. circular grinding, aligning, etc., the grown III-N bulk crystal can be individualized, preferably by wire sawing. The individualized III-N substrates may be obtained after further process steps, including, for example, lapping, polishing, edge chamfering, abrading flats or notches, annealing and/or various finishing steps. As a rule, lapping and polishing steps are multi-step processes.

The grown III-N bulk crystals as well as the III-N substrates obtained through the subsequent process steps now exhibit an excellent crystal quality and especially a homogenous distribution there in the growth direction, and also in the plane perpendicular thereto, due to the described measurement and control of the growth rate in real-time.

Methodologically, this crystal quality feature may be determined for example by X-ray diffraction, e.g. as a spatial distribution of absolute values and/or of full widths at half maximum of X-ray diffraction curves, corresponding to the diffraction at specific lattice planes. The homogeneity of the crystal quality in the growth plane or face may be ascertained for example by means of so-called X-ray rocking curve mappings (recording of ω scans at different locations of the sample), which have been recorded in a plane parallel to the growth plane or face. In the case of a growth in the [0001] direction, for example the reflection of the [0002] lattice planes can be used for the ω-scans.

The homogeneity of the crystal quality in the growth direction may be determined by means of the standard deviation of the full widths at half maximum of the [0002] scans of the single substrates which have been obtained from the corresponding bulk crystal.

Alternatively, the homogeneity of the crystal quality in the growth direction may be ascertained by means of rocking curve mappings which have been recorded in a plane, whose surface is oriented in the growth direction. In case of a growth in the [0001] direction, for example the reflection at an m-plane (i.e. selected from (1100) or (1010), (0110), (1100), (1010), (0110), (1100)) may be used in the scans, and the mapping may be carried out at a corresponding m-plane, or on a plane being slightly misoriented towards the corresponding m-plane by an off-angle between 0 and 10°.

A second method for the determination of the homogeneity of the crystal quality are micro Raman mappings. Thus, for example the standard deviations of frequency and full width at half maximum of a E$_2$-phonon in a scan of a plane parallel to the growth plane, or in the growth direction are indicative for the homogeneity of the crystal quality parallel to the growth plane or within the growth direction, respectively. The homogeneity of the crystal quality of the bulk crystal in the growth direction likewise may be preferably determined by means of the standard deviation of the mean values of the full widths at half maximum of the E$_2$-phonon of the single substrates which have been obtained from the corresponding bulk crystals.

EXAMPLES

A GaN substrate having a diameter of 50 to 60 mm is loaded into an Aixtron LP-HVPE reactor. The reactor is modified such that the weight of the growing GaN bulk crystal can be determined in real-time by means of a weighing module or load cell which measures the weight of the crystal including substrate holder and susceptor. The load cell, which is based on the geometry of a platform weighing module with beam bending and force feedback, is a load cell of type S2 of the company Hottinger Baldwin Meβtechnik GmbH (Darmstadt, Germany). The output signal is processed by a measurement amplifier. A bulk GaN crystal having a thickness of several mm is grown on the substrate. For example, the HVPE process takes place at a temperature of 1,040° C. to 1,075° C. and a pressure of 900 to 1,000 mbar with a V/III ratio of about 50 and a carrier gas composition of about 50% hydrogen and 50% nitrogen. The growth rate is 220 μm/h and is measured in real-time, and is and controlled in situ by adjusting the hydrogen chloride gas flow through/over the Ga source.

The rocking curve mappings are recorded with a commercial X-ray diffractometer having high resolution which is operated with a Cu Kα$_1$ beam and has an inward collimating optic. The diffractometer is optimized such that the broadening of the rocking curves due to the apparatus lies below 50%. The increment in ω is chosen such that at least 20 measurement points lie within the full width at half maximum. In the measurement on the sample surface, the [0002] reflection is used, and the increment in the x- and the y-direction is about 3 mm. The lateral dimensions of the focal point of the X-ray beam on the surface lies at $\leq 3$ mm. A margin of 2 mm from the wafer edge is excluded for the measurement.

The micro Raman measurements are carried out with a laser excitation wavelength of 532 nm (frequency doubler Nd:YAG laser), an excitation power of 3 mW as well as a Llabram800HR spectrometer of Jobin Yvon, wherein the laser is focused onto the sample by means of microscopic optics to a beam diameter of about 1 μm. The spectrometer is further calibrated by means of Ne plasma lines. The measurements are carried out in back scanning geometry, wherein the polarizar settings are chosen such that $E_2$-phonons can be detected [scanning on surface: z(y x/y)–z: scanning on slit face: y(x x)–y]. When scanning on the surface, the increment in x- and y-direction is about 2.5 mm. A margin of 2 mm from the wafer edge is excluded from measurement. When scanning on the wafer slit face lying perpendicular to the surface, the increment in z-direction is about 10 μm. Frequency and full width at half maximum of $E_2$-phonon is determined by Lorentz line form analysis.

It is noted that features of various aspects, advantages, embodiments and examples described above can be combined as desired.

What is claimed is:

1. A process for producing a III-N bulk crystal, wherein III denotes at least one element selected from Al, Ga and In, comprising the steps of growing a III-N bulk crystal by vapor phase epitaxy on a substrate or a template; and measuring a growth rate in real-time,
    wherein the step of measuring the growth rate in real-time is performed by a method selected from:
        weighing the III-N bulk crystal or the III-N bulk crystal and a III-N bulk crystal holder including a susceptor; or
        determining a duration or running time of an ultrasonic wave which is reflected from a growth surface of the III-N bulk crystal; or
        determining a crystal shadow obtained by illumination of the III-N bulk crystal and detecting movement of the crystal shadow behind the III-N bulk crystal; or
        determining an angle at which a laser beam reflected at a growth surface is detected.

2. The process according to claim 1, wherein the growth rate is actively controlled.

3. The process according to claim 1, wherein prior to the growth of the III-N bulk crystal, an intermediate layer is deposited on a substrate or a template on which the III-N bulk crystal is grown, wherein a composition of the intermediate layer is selected independently from a composition of the III-N bulk crystal.

4. The process according to claim 1, wherein the step of growing the III-N bulk crystal is performed using hydride vapor phase epitaxy.

5. The process according to claim 1, wherein a position of a growing front face of the III-N bulk crystal is kept constant by real-time control.

6. The process according to claim 1, wherein the III-N bulk crystal is grown on a III-N substrate or template having c-, a-, m- or r-plane as a growth plane or face, and the III-N bulk crystal is deposited on the growth plane/face.

7. The process according to claim 1, wherein the III-N bulk crystal is deposited on a III-N substrate having a growth plane or face having an miscut of 0.1-30° relative to the c-, a-, m- or r-plane.

8. The process according to claim 1, wherein a doped III-N bulk crystal is deposited on a doped III-N substrate or doped III-N template, and wherein an element selected from the group consisting of silicon, tellurium, magnesium and iron is used as a dopant.

9. The process according to claim 1, wherein an actual growth rate is maintained essentially constant during epitaxial growth.

10. The process according to claim 9, wherein a grown III-N bulk crystal has a circular or an almost circular in-plane cross-section having a diameter of $\geq 5$ cm.

11. The process according to claim 9, wherein a length of a grown III-N bulk crystal is $\geq 1$ mm.

12. The process according to claim 11, wherein the length of the grown III-N bulk crystal is $\geq 1$ cm.

13. The process according to claim 11, wherein the length of the grown III-N bulk crystal is $\geq 3$ cm.

14. The process according to claim 1, wherein a single crystalline form of sapphire, silicon carbide, gallium arsenide, lithium aluminate or silicon is used as a substrate or a template, and the III-N bulk crystal is grown on the substrate or on the template.

15. The process according to claim 1, wherein a substrate comprising a GaN surface is used as a substrate in a free-standing form or in a template form, and a GaN bulk crystal is grown.

16. A process for producing a III-N bulk crystal, wherein III denotes at least one element selected from Al, Ga and In, comprising the steps of growing a III-N bulk crystal by vapor phase epitaxy on a substrate or a template; and measuring a growth rate in real-time and actively controlling the growth rate, wherein the grown III-N bulk crystal has a circular or an almost circular in-plane cross-section having a diameter of $\geq 5$ cm, and a length of a grown III-N bulk crystal is $\geq 1$ mm; wherein when performing a rocking curve mapping of said III-N bulk crystal on a plane
    (i) parallel to a growth plane or
    (ii) in a growth direction,
    a standard deviation of a respectively measured full width at half maximum in case (i) is 5% or lower, or in case (ii) is 10% or lower.

17. A process for producing a III-N bulk crystal, wherein III denotes at least one element selected from Al, Ga and In, comprising the steps of growing a III-N bulk crystal by vapor phase epitaxy on a substrate or a template; and measuring a growth rate in real-time and actively controlling the growth rate, wherein the grown III-N bulk crystal has a circular or an almost circular in-plane cross-section having a diameter of $\geq 5$ cm, and a length of a grown III-N bulk crystal is $\geq 1$ mm; wherein when performing micro Raman mapping of said III-N bulk crystal on a plane
    (i) parallel to a growth plane, or
    (ii) in a growth direction,
    a standard deviation of a respectively measured full width at half maximum of $E_2$-phonon in case (i) is 5% or lower, or in case (ii) is 10% or lower.

18. The process according to claim 1, further comprising the step of separating one or more III-N substrates.

19. The process according to claim 18, wherein the step of separating one or more III-N substrates is carried out by wire sawing; and at least one further treatment step is carried out, selected from lapping, polishing, etching, additional thermal treatment, conditioning in gas atmosphere, or finishing steps.

20. A process for producing a free-standing III-N substrate, from a III-N bulk crystal, wherein III denotes at least one element selected from Al, Ga and In, comprising the steps of growing a III-N bulk crystal by vapor phase epitaxy on a substrate or a template; and measuring a growth rate in real-time and actively controlling the growth rate, wherein the grown III-N bulk crystal has a circular or an almost circular in-plane cross-section having a diameter of ≧5 cm, and a length of a grown III-N bulk crystal is ≧1 mm; further comprising the step of separating one or more III-N substrates to obtain said free-standing III-N substrate;

wherein when performing a rocking curve mapping on a plane parallel to a growth plane a standard deviation of a measured full width at half maximum is 5% or lower.

21. A process for producing a free-standing III-N substrate from a III-N bulk crystal, wherein III denotes at least one element selected from Al, Ga and In, comprising the steps of growing a III-N bulk crystal by vapor phase epitaxy on a substrate or a template; and measuring a growth rate in real-time and actively controlling the growth rate wherein the own III-N bulk crystal has a circular or an almost circular in-plane cross-section having a diameter of ≧5 cm, and a length of a grown III-N bulk crystal is ≧1 mm;

further comprising the step of separating one or more III-N substrates to obtain said free-standing III-N substrate;

wherein when performing a micro Raman mapping of said III-N substrate on a plane (i) parallel to a growth plane, or (ii) in a growth direction, a standard deviation of a respectively measured full width at half maximum of $E_2$-phonon in case (i) is 3% or lower, or in case (ii) is 5% or lower.

* * * * *